(12) United States Patent  
Dalton et al.

(10) Patent No.: US 8,198,103 B2  
(45) Date of Patent: Jun. 12, 2012

(54) ADDITION OF BALLAST HYDROCARBON GAS TO DOPED POLYSILICON ETCH MASKED BY RESIST

(75) Inventors: Timothy J. Dalton, Ridgefield, CT (US); Wesley C. Natzle, New Paltz, NY (US); Paul W. Pastel, Essex Junction, VT (US); Richard S. Wise, New Windsor, NY (US); Hongwen Yan, Somers, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 996 days.

(21) Appl. No.: 12/170,634

(22) Filed: Jul. 10, 2008

(65) Prior Publication Data

US 2008/0286972 A1    Nov. 20, 2008

Related U.S. Application Data

(63) Continuation of application No. 10/905,938, filed on Jan. 27, 2005, now abandoned.

(51) Int. Cl.  
*H01L 21/302* (2006.01)

(52) U.S. Cl. ............. 438/9; 438/714; 438/719; 438/909

(58) Field of Classification Search .......................... None  
See application file for complete search history.

(56) References Cited

U.S. PATENT DOCUMENTS

| | | | |
|---|---|---|---|
| 5,110,408 A | 5/1992 | Fujii et al. | |
| 5,194,118 A | 3/1993 | Shinohara | |
| 5,298,112 A | 3/1994 | Hayasaka et al. | |
| 5,480,051 A | 1/1996 | Hain | |
| 5,550,065 A | 8/1996 | Hashemi et al. | |
| 6,300,251 B1 | 10/2001 | Pradeep et al. | |
| 6,315,913 B1 | 11/2001 | Engelhardt et al. | |

(Continued)

FOREIGN PATENT DOCUMENTS

JP          51127763        10/1997

(Continued)

OTHER PUBLICATIONS

"Impact of chemistry on profile control of resist masked silicon gates etched in high density halogen-based plasmas"; Palla et al.; Journal of Vacuum Science B; 21(5); Sep. 2003; pp. 2174-2183 Sep.-Oct. 2003.

*Primary Examiner* — Anita Alanko  
(74) *Attorney, Agent, or Firm* — DeLio & Peterson, LLC; Kelly M. Nowak; Joseph Petrokaitis

(57) ABSTRACT

A chemical composition and method for providing uniform and consistent etching of gate stacks on a semiconductor wafer, whereby the composition includes an etchant and an added ballast gas added. The gate stacks are formed using this combined etchant and ballast gas composition. The ballast gas may either be similar to, or the equivalent of, a gaseous byproduct generated within the processing chamber. The ballast gas is added in either an overload amount, or in an amount sufficient to compensate for varying pattern factor changes across the water. This etchant and added ballast gas form a substantially homogeneous etchant across the entire wafer, thereby accommodating for or compensating for these pattern factor differences. When etching the wafer using this homogeneous etchant, a passivation layer is formed on exposed wafer surfaces. The passivation layer protects the lateral sidewalls of the gate stacks during etch to result in straighter gate stacks.

14 Claims, 5 Drawing Sheets

U.S. PATENT DOCUMENTS

| | | |
|---|---|---|
| 6,361,705 B1 | 3/2002 | Wang et al. |
| 6,451,705 B1 | 9/2002 | Trapp et al. |
| 6,492,068 B1 | 12/2002 | Suzuki |
| 6,527,968 B1 | 3/2003 | Wang et al. |
| 6,529,410 B1 | 3/2003 | Han et al. |
| 6,570,182 B2 | 5/2003 | Jeong et al. |
| 6,583,065 B1 | 6/2003 | Williams et al. |
| 6,630,410 B2 | 10/2003 | Trapp et al. |
| 2004/0074869 A1 | 4/2004 | Wang et al. |

FOREIGN PATENT DOCUMENTS

| | | |
|---|---|---|
| JP | 10135188 | 5/1998 |
| JP | 11186232 | 7/1999 |

ADDITION OF BALLAST HYDROCARBON GAS TO DOPED POLYSILICON ETCH MASKED BY RESIST

This is a continuation of application Ser. No. 10/905,938, filed on Jan. 27, 2005.

BACKGROUND OF THE INVENTION

1. Field of the Invention

This invention relates to the making of electronic components such as integrated circuit semiconductor devices, and in particular, to methods for providing more uniform and more consistent reactive ion etching techniques when pattern factors change, particularly when etching doped gate stacks.

2. Description of Related Art

Fabrication of integrated circuit devices typically requires numerous processing steps to deposit and pattern multiple layers of conducting and insulating materials. One of these processing steps includes dry etching. In a typical dry etch process, reactive species are first generated in a plasma. The species then diffuse to the substrate surface being etched, where they are adsorbed. A chemical reaction occurs, and a volatile by-product is formed. The by-product is then desorbed from the surface and diffused into the bulk of the gas.

RIE is one such type of dry etching that is often used to selectively etch a substrate on which desired features of an integrated circuit have been patterned using a process such as photo-lithography. RIE combines a physical basis (ion) and chemically reactive radicals to remove material from a surface of a semiconductor device to produce the desired features. RIE processing involves introducing a process gas into a chamber to generate a plasma, which is used to create an etch gas. This etch gas etches the substrate and creates volatile etch byproduct compounds which are typically evacuated from the chamber.

Essentially all RIE processes are carried out on patterned substrates comprising at least two materials. One is a material to be etched, and the other is a material that masks the material to be etched. In processes that rely predominantly on the physical mechanism of sputtering, the strongly directional nature of the incident energetic ions allows substrate material to be removed in an anisotropic manner (i.e., essentially vertical etch profiles are produced). Unfortunately, such material removal mechanisms are also non-selective against masking material and the varying materials underlying the layers being etched, such that, these materials may also be consumed during the patterning of the unmasked material. It is also inevitable in certain material combinations that the reaction products from the mask material, or the reaction products from the material to be etched, can interact with the plasma and impact the etch rate or profile. These various etching/masking material combinations on wafers interacting with the plasma are sources of profile and etch rate variations.

For example, there are a number of prior art references which discuss the etching of structures containing gate stacks having silicon, doped silicon, polysilicon or doped polysilicon layers using a variety of etch chemistries. These structures can be RIE etched using either a hard mask or a photo resist mask material (i.e., a soft mask). However, where a hard mask is used alone to etch the various etching/masking material combinations, serious problems can occur due to undercutting of doped regions of the gate stacks. Thus, trends have leaned towards the use of photo resist soft mask materials, such as a hydrocarbon containing photo resist mask material, with or without the addition of a hard mask.

It has been found that the hydrocarbon containing photo resist material often plays a roll in the etch chemistry. In particular, as the structure is etched, the RIE etch chemistry consumes the hydrocarbon containing photo resist mask material, in addition to the desired etching materials, such that hydrocarbon containing species desorb from the surface of the photo resist mask material and diffuse into the bulk RIE etch chemistry. These hydrocarbon containing species form passivation layers on sidewalls of the gate stack layers to prevent the lateral etching thereof during the RIE process.

However, this process of relying on the photo resist material as an active part of the etch chemistry is undesirable as it is highly dependent upon the amount of hydrocarbons contained within the photo resist material. Further, as the pattern factors differ of the varying patterns etched into the photo resist material across the structure being etched, the local production of hydrocarbons may vary with proximity to masked areas. This results in varying amounts of hydrocarbons desorbing from the various masked structures across the structure, which can ultimately lead to the problem of microloading (i.e., having greater concentrations of hydrocarbons in certain areas of the structure as compared to other areas thereof). These microloading factors can deleteriously impact both etch rates and etch profiles to varying degrees across the structure being etched (known in the industry as through-pitch variation), as well as cause undesirable profile differences in the gate stacks, substantial part to part variation, and even alteration of the photo resist material itself. Through-pitch variations in etch profiles substantially degrades the transistor performance.

Accordingly, a need continues to exist in the art for providing more uniform and more consistent reactive ion etching techniques when pattern factors change across the structure to be etched.

SUMMARY OF THE INVENTION

Bearing in mind the problems and deficiencies of the prior art, it is therefore an object of the present invention to provide uniform and consistent reactive ion etching techniques when pattern factors change across the structure to be etched.

It is another object of the present invention to provide improved reactive ion etching techniques that take into account the impact of local photo resist consumption on etch rates and/or etch profiles.

A further object of the invention is to provide improved reactive ion etching techniques that compensate or accommodate for pattern factor differences across the structure to be etched.

It is yet another object of the present invention to provide improved reactive ion etching techniques that avoid the problems associated with microloading including, but not limited to, deleteriously affects on both etch rates and etch profiles, through-pitch variation in critical dimension, substantial part to part variation, and substantial alteration of the photo resist material itself.

Still other objects and advantages of the invention will in part be obvious and will in part be apparent from the specification.

The above and other objects, which will be apparent to those skilled in art, are achieved in the present invention, which is directed to in a first aspect a method for etching gate stacks on a semiconductor wafer. The method includes providing a semiconductor wafer having a gate stack layer within a processing chamber and flowing an etchant into the processing chamber. An overload amount of a ballast gas is added within the processing chamber to form a substantially homogeneous etchant across the semiconductor wafer. In so doing, the homogeneous etchant has a higher concentration of the ballast gas as compared to the etchant. A gate stack is then etched into the gate stack layer by contacting the gate stack layer with the substantially homogeneous etchant. Simultaneously, a passivation layer is deposited over all exposed surfaces during the etching using the ballast gas within the substantially homogeneous etchant to provide substantially uniform etching results.

In this aspect of the invention, the ballast gas may be a carbon containing gas having a chemical formula $C_xH_y$, wherein x is an integer ranging from 1 to 10, and y is an integer ranging from 2 to 22. Alternatively, the ballast gas may be a carbon containing gas having a chemical formula $C_xH_yA$, wherein x is an integer ranging from 1 to 10, y is an integer ranging from 0 to 21, and A represents at least one additional substituent selected from the group consisting of O, N, S, P, F, Cl, Br, I, or combinations thereof.

In another aspect, the invention is directed to a method for etching gate stacks on a semiconductor wafer. The method includes providing a semiconductor wafer that has a patterned photo resist layer over a gate stack layer within a processing chamber, and flowing an etchant into such processing chamber. The etchant is contacted to the semiconductor wafer to generate a reaction by-product that is diffused throughout the etchant at varying concentrations across the semiconductor wafer. A ballast gas is then added within the processing chamber to equilibrate the varying concentrations of the reaction by-product and provide a substantially homogeneous etchant across the semiconductor wafer. A gate stack is etched in the ate stack layer using the patterned photo resist layer by contacting the gate stack layer with the substantially homogeneous etchant, while simultaneously depositing a passivation layer over all exposed surfaces during the etching to provide substantially uniform etching results.

The gate stack layer may be either a dual gate stack layer or a uniformly pre-doped region. It may be composed of a material such as, silicon, doped silicon, polysilicon, doped polysilicon, germanium, silicon germanium, silicon germanium carbon, mixtures thereof, alloys thereof or multilayers thereof. Optionally, a hard mask layer may reside between the photo resist layer and the gate stack layer.

The etchant may be a halogen-based plasma in the presence of an oxygen gas, a halogen-based plasma in the presence of a nitrogen gas, or mixtures thereof. In this aspect, the reaction by-product may be gaseous by-products desorbed from a surface of the photo resist layer, gaseous particles desorbed from a surface of the gate stack layer, or both. As such, the ballast gas and the reaction by-product may be identical gases or they may be equivalent to one another. This ballast gas may be either overloaded into the processing chamber, or it may be added to the processing chamber in an amount sufficient to compensate for varying patterns of the patterned photo resist layer residing across the semiconductor wafer, and the varying amounts of the reaction by-product desorbed from the varying patterned photo resist layer and diffused at varying concentrations throughout the etchant.

Wherein the patterned photo resist layer is a patterned hydrocarbon containing resist layer, upon contact with the etchant, it is hydrocarbon containing species that are desorbed from the patterned hydrocarbon containing resist layer and diffused throughout the etchant at varying concentrations across the semiconductor wafer. As such, the ballast gas is a carbon containing ballast gas added to the processing chamber to equilibrate the varying concentrations of the hydrocarbon containing species throughout such etchant. The carbon containing ballast gas may have a chemical formula $C_xH_y$, wherein x is an integer ranging from 1 to 10, and y is an integer ranging from 2 to 22. Alternatively, the carbon containing ballast gas may have a chemical formula $C_xH_yA$, wherein x is an integer ranging from 1 to 10, y is an integer ranging from 0 to 21, and A represents at least one additional substituent selected from the group consisting of O, N, S, P, F, Cl, Br, I, or combinations thereof.

In another aspect, the invention is directed to a chemical composition for etching gate stacks on a semiconductor wafer. The composition includes an etchant having desorbed hydrocarbon containing species diffused at varying concentrations throughout the etchant, and a carbon containing ballast gas added to the etchant. This carbon containing ballast gas is added to the etchant such that it equilibrates the varying concentrations of the hydrocarbon containing species throughout the etchant to provide a substantially homogeneous etchant. The ballast gas may have a chemical formula $C_xH_y$, or it may have a chemical formula $C_xH_yA$.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1A-12B of the drawings in which like numerals refer to like features of the invention.

The present invention relates to methods for providing more uniform and more consistent Reactive Ion Etching (RIE) when pattern factors change, and in particular, when etching doped gate stacks, for example, in complementary metal oxide semiconductor (CMOS) devices and metal oxide semiconductor field effect transistors (MOSFETs).

Figure 1A:
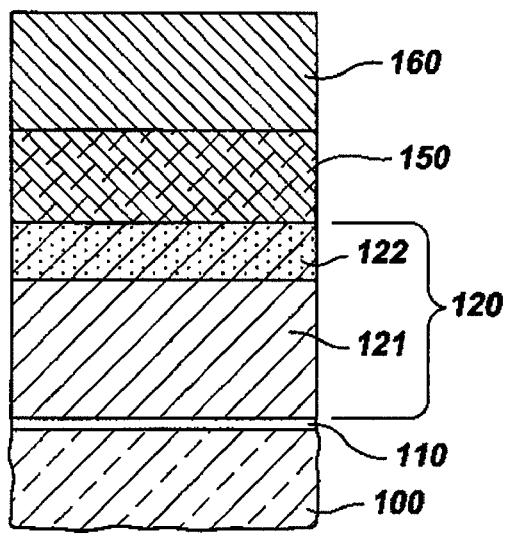
FIGS. 1A-B are cross-sectional views of portions of semiconductor wafers each having hydrocarbon photo resist soft mask materials over, respectively, a dual gate stack layer having doped and non-doped regions (FIG. 1A), and a uniformly doped gate stack layer (FIG. 1B).
Figure 1B:
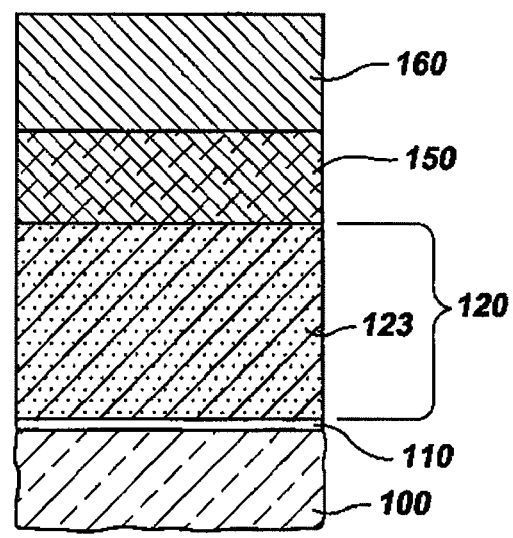

Referring to FIGS. 1A-B, multilayer semiconductor wafers are shown whereby a gate dielectric layer 110 is formed on a substrate 100. A conductive layer 120 is formed over the gate dielectric layer 110. This conductive layer 120 may include any known conductive materials used in the art including, but not limited to, at least one conductive material selected from Si, polySi, Ge, SiGe, SiGeC, mixtures thereof, alloys thereof and multilayers of the same having any stoicheometric ratio. A preferred material for conductive layer 120 is polysilicon. The conductive layer 120 may be a dual gate stack layer of essentially non-doped 121 and pre-doped 122 regions (FIG. 1A), or alternatively it may be a generally uniformly pre-doped region 123 (FIG. 1B). These layers of the dual gate stack 121/122 or single pre-doped stack 123 may be doped with any known p+ type or n+ type dopants including, but not limited to, p+ type dopants such as B, Al, Ga, In and TI, or n+ type dopants such as P, N, As, Sb and Bi.

In a first aspect of the invention, a layer of anti-reflective coating (ARC) 150 may be deposited directly over the conductive layer 120. The ARC layer may comprise any organic-based material known suitable for ARC. ARC 150 can be deposited, for example, by CVD, plasma-assisted CVD, evaporation, chemical solution deposition, and other like deposition processes. The physical thickness of the ARC may vary, and can be, for example, from about 20 nm to about 150 nm.

A layer of softmask photo resist material 160 is then deposited directly over the ARC layer 150. The softmask photo resist material 160 may include any conventional organic-based photo resist material, such as a hydrocarbon containing material. The photo resist material 160 may be deposited, for example, by CVD, plasma-assisted CVD, evaporation, chemical solution deposition, and other like deposition processes. The physical thickness of the photo resist material may vary, such as, for example ranging from about 40 nm to about 600 nm.

Figure 5A:
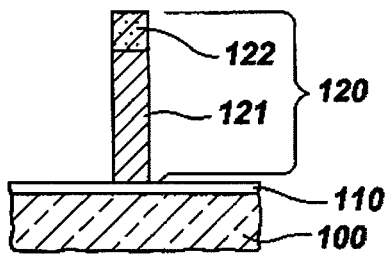
FIGS. 5A-B are cross-sectional views, respectively, of FIGS. 4A-B showing the step of removing the passivation layer, softmask layer, and ARC layer.
Figure 5B:
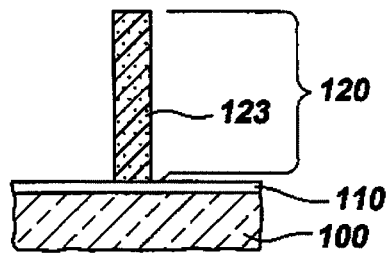
Figure 6A:
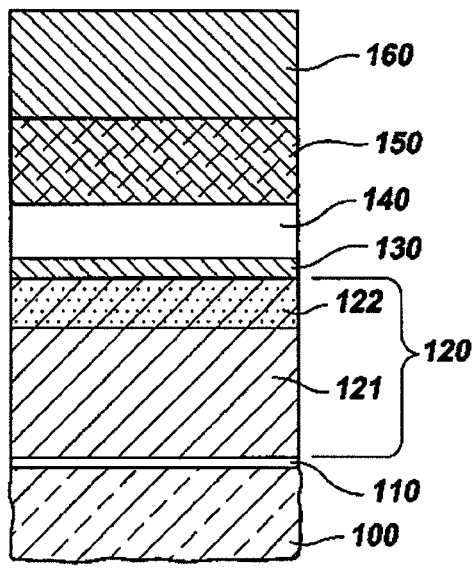
FIGS. 6A-B are cross-sectional views of portions of semiconductor wafers each having hydrocarbon photo resist soft mask materials in combination with hard mask materials over, respectively, a dual gate stack layer having doped and non-doped regions (FIG. 6A), and a uniformly doped gate stack layer (FIG. 6B).
Figure 6B:
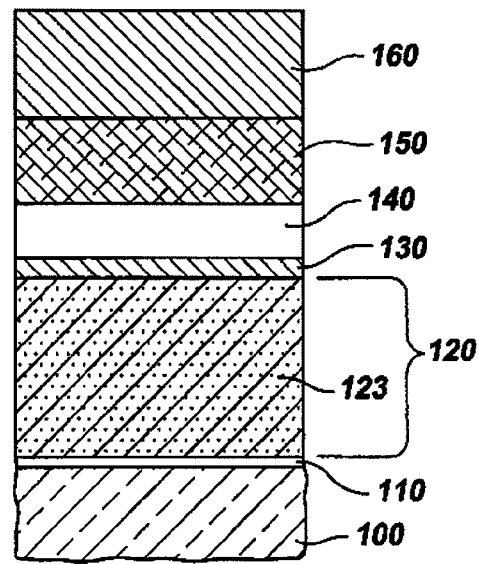

Optionally, referring to FIGS. 5A-B, the multilayer semiconductor wafers may further include a hard mask layer. In this aspect of the invention, once the conductive layer 120 is formed, a barrier layer 130, such as a nitride layer, is formed directly over the conductive layer 120 followed by a hard mask layer 140. The hard mask material may include any conventional material suitable for use as a hard mask, such as an oxide layer. The ARC layer 150 followed by the softmask photo resist layer 160 are then deposited over the hard mask layer 140.

In another embodiment, referring to FIGS. 11A-12B, the multilayer semiconductor wafers may include only a barrier layer 130 followed by a hard mask layer 140 formed over the conductive layer 120. Again, the hard mask material may include any conventional material suitable for use as a hard mask, such as an oxide layer.

Figure 2A:
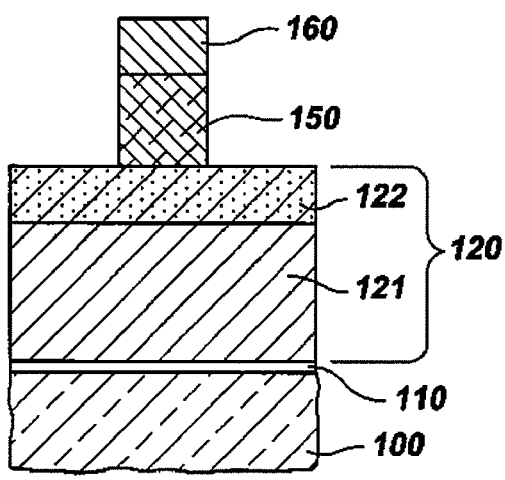
FIGS. 2A-B are cross-sectional views, respectively, of FIGS. 1A-B showing the photo resist soft mask materials being patterned and etched.
Figure 2B:
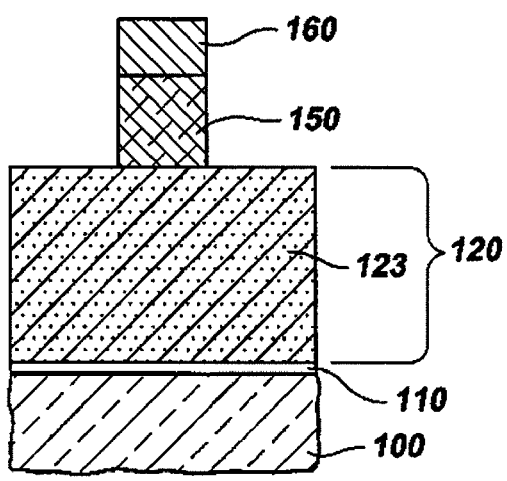
Figure 7A:
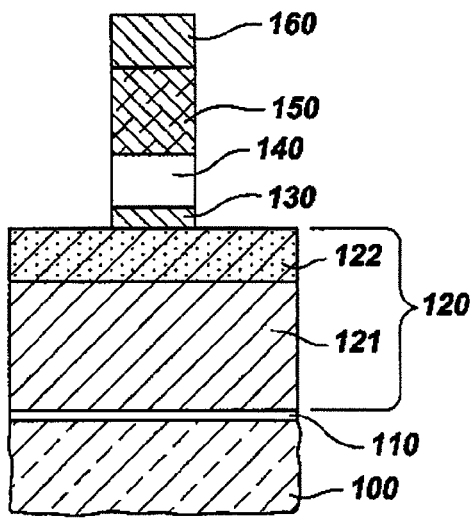
FIGS. 7A-B are cross-sectional views, respectively, of FIGS. 6A-B showing the photo resist soft mask materials and the hard mask materials being patterned and etched.
Figure 7B:
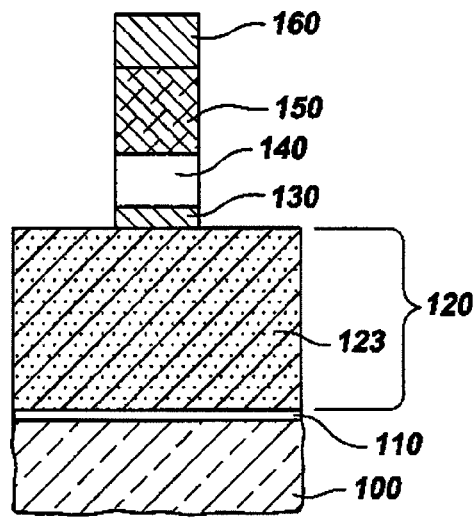
Figure 8A:
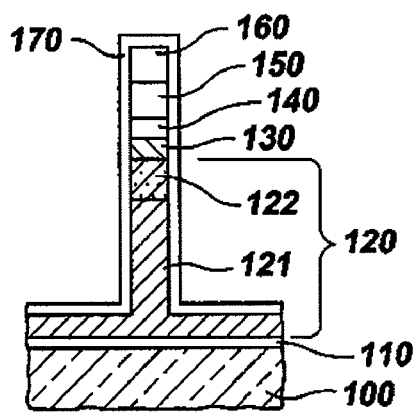
FIGS. 8A-B are cross-sectional views, respectively, of FIGS. 7A-B showing the patterns being continued into the dual gate stack and the uniformly doped gate stack whereby a ballast gas flow is added to the etch chemistry to form a passivation layer over all exposed surfaces.
Figure 8B:
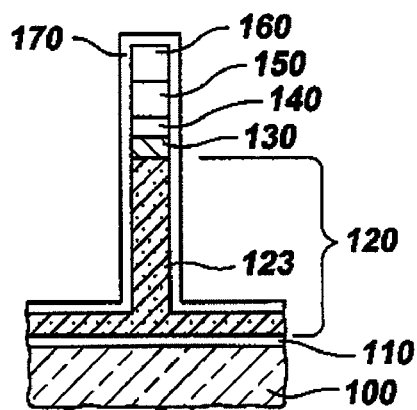
Figure 9A:
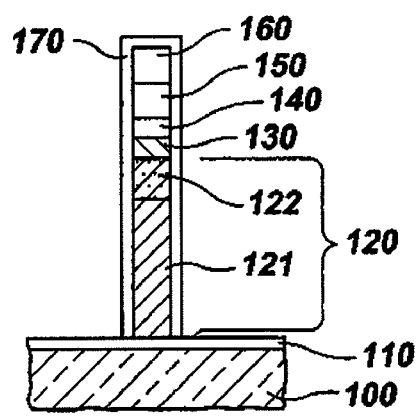
FIGS. 9A-B are cross-sectional views, respectively, of FIGS. 8A-B showing the resultant gate stack whereby the passivation layer covers only the gate stack layers and any remaining soft mask and hard mask layering.
Figure 9B:
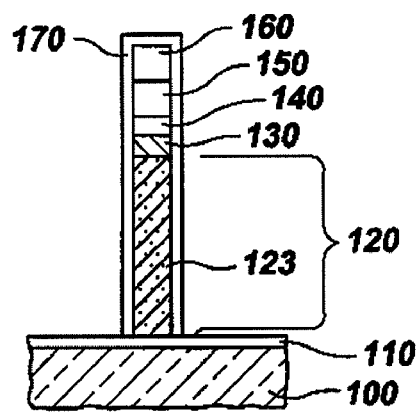
Figure 10A:
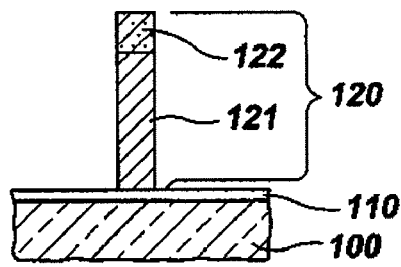
FIGS. 10A-B are cross-sectional views, respectively, of FIGS. 9A-B showing the step of removing the passivation layer, photo resist soft mask materials and the hard mask materials.
Figure 10B:
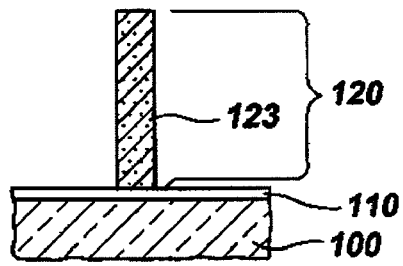
Figure 11A:
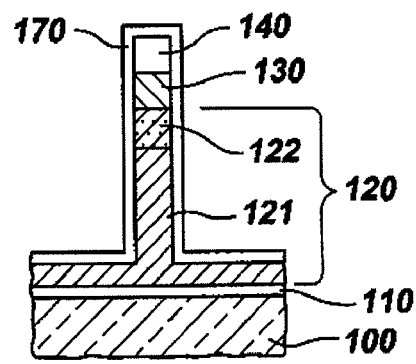
FIGS. 11A-B are cross-sectional views of portions of semiconductor wafers each having hard mask materials over, respectively, a dual gate stack layer having doped and non-doped regions (FIG. 11A) and a uniformly doped gate stack layer (FIG. 11B), whereby a passivation layer has been formed over all exposed surfaces in accordance with the invention during the formation of the gate stack layers.
Figure 11B:
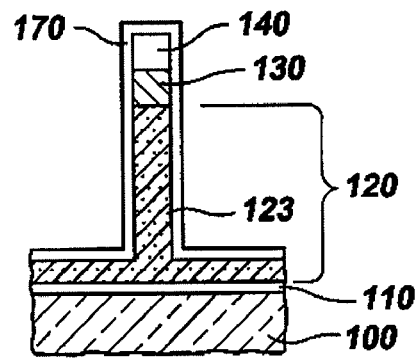
Figure 12A:
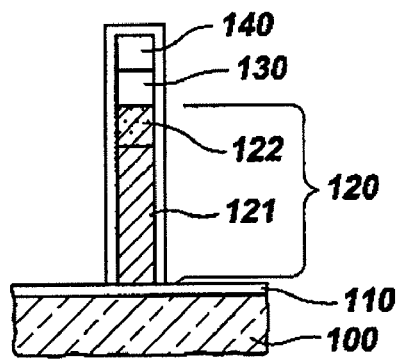
FIGS. 12A-B are cross-sectional views, respectively, of FIGS. 11A-B showing the resultant gate stack whereby the passivation layer covers only the gate stack layers and any remaining hard mask layering.
Figure 12B:
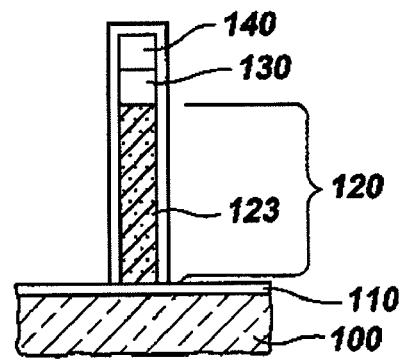

Referring to FIGS. 2A-B, once the multilayer semiconductor wafer stacks are provided with only a softmask photo resist, the softmask photo resist layer 160 and ARC layer 150 may be patterned and etched using any methods known in the art, such as, for example, conventional lithography. Similarly, wherein the multilayer semiconductor wafer stacks are provided with a softmask photo resist in addition to a hard mask, these layers may also be patterned and etched using known methods. In so doing, as is shown in FIGS. 7A-B, the softmask photo resist/ARC layers 160/150 are patterned, and then this pattern is transferred into the hard mask/barrier layers 140/130. Referring to FIGS. 11A-11B, the patterned layers may alternatively only include patterned hard mask/barrier layers 140/130 over the conductive layer 120.

For instance, the softmask photo resist layer 160 and ARC layer 150 may be patterned and etched using etchants including, but not limited to, $N^2$, Br, Cl, or an $O_2$ based plasma with some inert gases, such as, He or Ar. The processing conditions may including pressures ranging from about 5 mTorr to about 75 mTorr, an rf source power of about 100 Watts to about 800 Watts, an rf bias power of about 5 Watts to about 100 Watts, all performed within a capacitive coupled or an inductive coupled plasma chamber. The hard mask layers 130/140 may be patterned and etched using etchants including, but not limited to, fluorocarbon containing gases, such $CF_4$, $CHF_3$, $CH_2F_2$, $CH_3F$, $C_2F_4$, etc., gaseous mixtures of oxygen or hydrogen, such as, CO or $CO_2$, with some inert gases, such as, He or Ar. The processing conditions may including pressures ranging from about 15 mTorr to about 200 mTorr, an rf source power of about 100 Watts to about 500 Watts, an rf bias power of about 50 Watts to about 250 Watts, all performed within a capacitive coupled or an inductive coupled plasma chamber In accordance with the invention, the patterns of FIGS. 2A-B and 7A-B are transferred into the underlying conductive layers 120 to form gate stacks. In so doing, wherein the structure being processed includes soft mask materials, an essential feature of the invention is that the softmask photo resist layers 160 remain over the conductive layers 120 during such etching process. An RIE etchant is provided within the processing chamber, in which the multilayer semiconductor wafer is being processed. This etchant composition may include, but is not limited to, at least one of any halogen-based plasmas (i.e. an F, Cl, Br, or I based plasma) or mixtures thereof, in the presence of a gas, such as $O_2$ or $N^2$, or even mixtures thereof.

As the RIE etch chemistry is provided within the processing chamber, it consumes softmask photo resist layer materials 160, in addition to the conductive layers 120. This causes particles of the softmask photo resist layer materials to be diffused into the RIE etch chemistry within the processing chamber. For instance, in the preferred embodiment wherein the softmask photo resist layer 160 is a hydrocarbon containing material, hydrocarbon containing species desorb from the surface of the photo resist and diffuse into the bulk RIE etch chemistry. These hydrocarbon containing species are then deposited onto the exposed gate stack sidewalls of the conductive layer 120, as well as exposed horizontal surfaces during the etching process, to form the passivation layers 170 over all such exposed surfaces. The passivation layer 170 formed on the gate stack sidewalls prevents the lateral etching of such conductive layer 120, as well as directs the etchant towards the exposed top surfaces of the conductive layers 120 for etching thereof, to result in straighter gate stacks.

Yet, as pattern factors of the varying patterns etched into the photo resist material change across the wafer, varying concentrations of hydrocarbons will exist within these differing patterns of soft mask photo resist material residing across the wafer. These varying hydrocarbon concentrations will ultimately lead to varying amounts of hydrocarbons desorbing from the patterned soft mask photo resist materials and being introduced into the gas etchant across the wafer, which ultimately leads to microloading and the problems associated therewith. Also, these varying concentrations of hydrocarbon containing species will form differing passivation layers across the wafer, some of which may be inadequate for fully protecting the lateral sidewalls of the conductive layer during the etch process. For instance, wherein a passivation layer is not formed on the gate stack sidewalls, or does not completely cover such gate stack sidewalls, exposed portions of the gate stack sidewalls may be undesirably undercut during the etch process. These problems can further deleteriously affect etch rates and profiles, as well as cause substantial profile to profile variation, substantial part to part variation, and substantial alteration of the photo resist material itself.

Further adding to the above problems is the complexity of etching these varying soft mask photo resist layer materials 160 and conductive layer materials 120 residing on the wafer. For instance, wherein the conductive layer is a dual pre-doped gate stack containing both n+ type and p+ type dopants on the same wafer (e.g. layers 121/122), fabrication challenges may be present that would otherwise not be present on a wafer with a single type doped conductive layer (e.g. layer 123). Chlorine and bromine based plasmas have conventionally been used to etch polysilicon gate stacks due to their selectivity of etching polysilicon over other gate materials, such as silicon oxide. However, when such plasmas are used to etch dual pre-doped stacks, the n+ doped regions etch much faster in both vertical and lateral directions than the p+ doped regions, which results in undesirable profile differences between such n+ and p+ doped poly-Si gate stacks.

The present invention overcomes the above problems associated with RIE etching when pattern factors of the varying patterns etched into the photo resist material change across the wafer by advantageously accommodating for or compensating for these varying pattern factor differences across the wafer. This is accomplished by introducing a ballast gas flow into the processing chamber for maintaining a substantially uniform concentration of hydrocarbon containing species within the RIE etch chemistry across the entire wafer to ensure the formation of passivation layers 170 on both lateral sidewalls of the gate stack and the exposed bottom surfaces of the conductive layer during etching thereof.

Referring to FIGS. 3A-B and 8A-B, in accordance with the invention, wherein the structure being processed contains soft mask materials, the ballast gas flow is either overloaded within the processing chamber or provided in an amount sufficient to compensate for the pattern factor changes across the wafer being processed (i.e., the resist composition related differences in the contributed flow). However, referring to FIG. 11A-11B, wherein the structure being processed contains only hard mask materials, the ballast gas flow is overloaded within the processing chamber.

The ballast gas flow may be a gas the same as, similar to or the equivalent of a reaction product generated within the processing chamber. That is, the ballast gas flow and the reaction product may both have the same chemical and physical properties and characteristics for forming passivation layers 170. The ballast gas flow is selected to passivate the masking material and the doped silicon sidewalls and exposed bottom surfaces, and as such, may be dissimiliar to the materials evolved from the masking material. In accordance with the invention, this reaction product may be a by-product generated by reaction of the RIE etch chemistry with the soft mask photo resist material, reaction of the RIE etch chemistry with the etched underlying conductive material, or even both. In a preferred embodiment, wherein the structure contains soft mask materials, the reaction product is preferably a by-product desorbed from the soft mask photo resist material 160 as a result of reaction between the soft mask photo resist material and the etch chemistry used to etch conductive layer 120.

Wherein the structure being processed contains soft mask materials, this soft mask photo resist material 160 generally has a high fractional composition of unsaturated aromatic hydrocarbon compounds. As the RIE etch proceeds, these unsaturated aromatic hydrocarbon compounds decompose and are released into the RIE chemistry within the processing chamber. Thus, the ballast gas flow preferably comprises at least one carbon containing gas. In one embodiment, the ballast gas flow is a hydrocarbon containing gas having the chemical formula $C_xH_y$, wherein x is an integer ranging from 1 to 10, and y is an integer ranging from 2 to 22. Alternatively, it may be a hydrocarbon containing gas having the chemical formula $C_xH_yA$, wherein x is an integer ranging from 1 to 10, y is an integer ranging from 0 to 21, more preferably from 2 to 21, and A represents at least one additional substituent including O, N, S, P, F, Cl, Br, I, or even combinations thereof. Wherein the structure being processed contains only hard mask materials, the ballast gas flow preferably comprises at least one carbon containing gas overloaded within the processing chamber, and more preferably is a hydrocarbon containing gas having the chemical formula $C_xH_y$, wherein x is an integer ranging from 1 to 10, and y is an integer ranging from 2 to 22.

For example, the ballast gas flow may be an unsaturated ethylene or acetylene gas added to the etch chemistry within the processing chamber to "simulate" the soft mask photo resist material decomposition. However, it will be appreciated by one skilled in the art that numerous other soft mask photo resist material to gate stack layer combinations are possible. In the preferred embodiment, wherein the soft mask photo resist is a hydrocarbon material, this ballast gas flow is added to the etch chemistry to make the environment surrounding the wafer to be more uniform and homogeneous with hydrocarbon species for etching underlying conductive material (preferably, polysilicon). This uniform etch chemistry across the entire wafer being processed significantly reduces any potential for microloading factors, as well as provides more uniform etch results and improvements in through-pitch performance.

Again, the ballast gas flow may either be overloaded within the processing chamber or added in an amount sufficient to compensate for pattern factor changes. Wherein the ballast gas flow is overloaded within the processing chamber, it is added to the etch chemistry in an amount whereby the ballast gas flow is the dominating constituent within the etchant. In so doing, the ballast gas flow may be provided into the processing chamber in amounts ranging from about 5 sccm to about 100 sccm, preferably from about 5 sccm to about 20 sccm, such that the amount of desorbed hydrocarbon contribution from resist consumption is only a small fraction of the total hydrocarbon flow within the etch chemistry. The temperature may range from about 25° C. to about 85° C., preferably from about 30° C. to about 75° C.

Figure 3A:
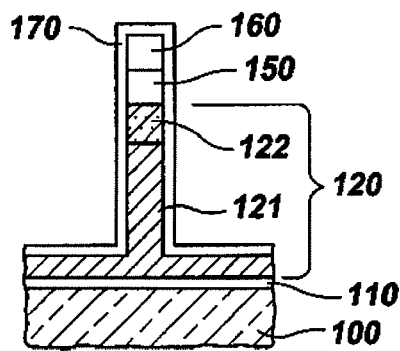
FIGS. 3A-B are cross-sectional views, respectively, of FIGS. 2A-B showing the patterns being continued into the dual gate stack and the uniformly doped gate stack whereby a ballast gas flow is added to the etch chemistry to form a passivation layer over all exposed surfaces.
Figure 3B:
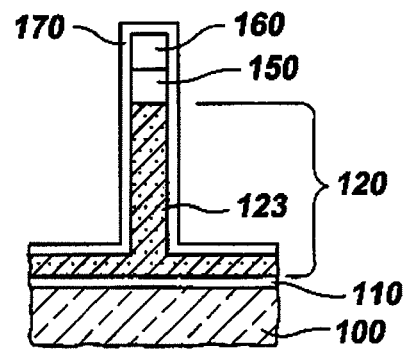
Figure 4A:
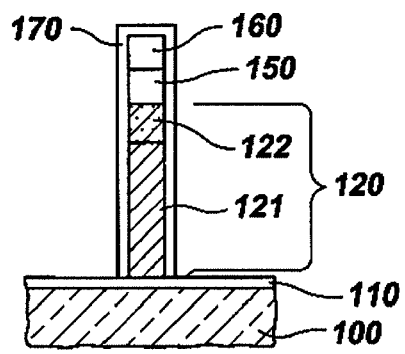
FIGS. 4A-B are cross-sectional views, respectively, of FIGS. 3A-B showing the resultant gate stack whereby the passivation layer covers only the gate stack layers and any remaining soft mask layers.
Figure 4B:
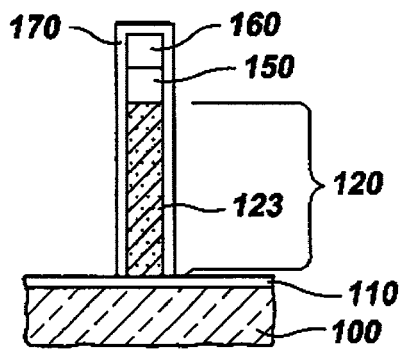

In this aspect of the invention, it is not necessary to take into account the actual pattern factor changes (i.e., micropatterning density differences) on the wafer since the processing chamber is overloaded or dominated with this ballast gas flow. This overloading of ballast gas flow allows for the formation of passivation layers 170 at least on the vertical sidewalls of the gate stack to prevent such layers from being damaged during etching, as well as enabling the formation of straighter gate stacks. As the etch proceeds, a thin passivation layer 170 is also formed on the horizontal exposed surfaces of conductive layer 120, as is shown in FIGS. 3A-B, 8-AB, 11A-B. In so doing, during the process of etching the conductive layer 120 to form the gate stack, the incident ion flux from the plasma acts to physically remove the thin passivation layer on surfaces incident to such plasma. In particular, the incident ion flux physically removes the thin passivation layer from the exposed horizontal surface on the conductive layer 120. During this process, the degree of sputtering decreases dramatically with the incident angle to preserve the deposited passivation layer on the silicon sidewalls. As is shown in FIGS. 4A-B, 9A-B and 12A-B, upon completion of this etching step, the passivation layer 170 remains and covers only any remaining soft mask and/or hard mask materials, as well as the resultant gate stack layers.

Alternatively, wherein the structure contains soft mask materials, the ballast gas flow may be provided within the processing chamber in an amount sufficient to compensate for pattern factor changes across the wafer being processed to form the passivation layers 170 shown in FIGS. 3A-B and 8-AB during the etch step, and the resultant structures shown in FIGS. 4A-B and 9A-B upon etch completion.

In this aspect of the invention, lesser amounts of hydrocarbons are typically added to the etch chemistry, as compared to the above aspect of overloading the etch chemistry. However, this total added amount is dependent upon the soft mask photo resist patterning differences across the wafer. That is, the added amount is designed to compensate for these soft mask photo resist pattern differences, which cause varying amounts of hydrocarbons to be added to the etch chemistry across the wafer. For instance, a lesser amount of compensating gaseous hydrocarbons may be added to the etch chemistry when there is a large surface area of exposed soft mask photo resist material for interacting with the etch chemistry, which allows for increased concentrations of desorbed hydrocarbon containing species to mix with the etch chemistry. Conversely, a large amount of compensating gaseous hydrocarbon may be required to be added to the etch chemistry when there is a small amount of exposed surface area of soft mask photo resist materials for interacting with the etch chemistry.

In a preferred embodiment of compensating for the pattern factor differences, the percentage of soft mask photo resist pattern differences across the wafer is first determined. This may be accomplished by calculating the pattern differences across the wafer based on the actual patterned soft mask photo resist material, or based on a desired pattern to be etched within such soft mask. Using this percentage of pattern factor differences, the required amount of ballast gas flow is calculated that will compensate for such pattern factor differences. The above calculations may preferably be performed by an automated factory system. However, wherein the structure being processed contains only hard mask materials, the system is overloaded with the ballast gas flow since there is no need to determine the actual pattern factor loading. In this aspect, the gas phase deposition of passivant will have an inverse pattern factor dependence, whereby diffusivity will reduce passivant deposition in nested areas relative to open pitch structures. This will tend to compensate for the inherent microloading of resist-generated passivant materials.

For instance, in a soft mask containing structure, where it has been determined that a 10% pattern factor difference exists across the soft mask photo resist layer 160 that is consumed by the etch chemistry at a rate of about 200 nm to about 240 nm in a 3 minute etch period, this would generate on the order of about 5 sccm of a single carbon containing species from a 300 mm wafer within the etch chemistry. Thus, the addition of about 5 sccm of a single carbon containing species to the etch chemistry would lower the resist and pattern factor sensitivity of the process so that photo resist dependent etch effects will be minimized. However, wherein a 20% pattern factor difference exists, on the order of about 10 sccm of a single carbon containing species would be required, while on the order of about 5 sccm of a double carbon containing species like $C_2H_4$ would be required to provide substantial ballast and thereby lower the resist and pattern factor sensitivity of the process to minimize the effect of the soft mask photo resist dependent etch.

Further, wherein it has been determined that etch by-products generated from the reaction between the etch chemistry and the conductive material negatively impact the etching of such conductive material, the pattern factor differences of conductive material across the wafer may also be used to alter the etch chemistry in accordance with the invention, as discussed in detail above. These pattern factor differences of the conductive material comprise the varying amounts of conductive layers exposed between the gate stacks being formed. For instance, if etch by-products generated from the etch chemistry contacting a doped polysilicon layer negatively impact the etching of such doped polysilicon layer, then the pattern factor differences of such doped polysilicon layer may be compensated for by adding reaction products including, but not limited to, $SiBr_4$, $SiHBr_3$, $SiH_2Br_2$ or other like halogen containing silicon compounds. The present invention may also be used to compensate for pattern factor differences of the metal gate by providing gaseous reaction products of such metal RIE process as a gaseous input to the RIE reaction. It should be appreciated that various other pattern factor differences existing across the wafer being processed may be compensated for in accordance with the invention in order to provide significantly improved RIE processing that generate more uniform and consistent results.

Referring to FIGS. 5A-B and 10A-B, once the ballast gas flow has been added to the etch chemistry, the passivation layers 170 formed to protect the lateral sidewalls of the etched structure and the resultant gate stacks have been formed within the conductive layer 120, any remaining passivation layer 170 is then removed. In so doing, remaining passivation layer 170, softmask layer 160, and ARC layer 150 are removed such that the resultant gate stack is provided with substantially straight sidewalls, as is shown in FIG. 5A-B. Alternatively, any remaining passivation layer 170, softmask layer 160, ARC layer 150, hard mask layer 140 and barrier layer 130 may be removed to provide the gate stack of FIGS. 1A-B having substantially straight sidewalls. Similarly, the remaining passivation layer 170, hard mask layer 140 and barrier layer 130 of FIG. 12B may be removed to provide a gate stack having substantially straight sidewalls.

Accordingly, the present invention advantageously provides more uniform and consistent reactive ion etching techniques when pattern factors change across the structure being etched. By processing a semiconductor wafer in accordance with the invention, the ballast gas flows make variations in the amount of resist erosion insignificant, as well as may compensate for variations in the patterned soft mask photo resist. This is accomplished by taking into account the impact of photo resist consumption on etch rates and/or etch profiles. A much higher product wafer yield is realized in accordance with the method steps and process flow of the present invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for etching a gate on a semiconductor wafer comprising:
   providing a semiconductor wafer having a photo resist layer with varying patterns with varying concentrations of hydrocarbons over a gate layer;
   providing said semiconductor wafer within a processing chamber;
   flowing an etchant into said processing chamber;
   contacting said etchant to said semiconductor wafer to generate varying concentrations of a hydrocarbon-containing reaction by-product across said varying patterns of said photo resist layer;
   determining a percentage of photo resist layer pattern differences across the semiconductor wafer;
   calculating an amount of a gas that compensates for said pattern differences using said percentage;
   adding said amount of gas within said processing chamber to compensate for said varying concentrations of said hydrocarbon-containing reaction by-product across said varying patterns by forming a homogeneous etchant having a uniform concentration of hydrocarbons across the entire said semiconductor wafer;
   maintaining said homogeneous etchant across said entire semiconductor wafer by controlling an amount of said hydrocarbon gas added to said processing chamber;
   etching a gate in said gate layer by contacting said gate layer with said homogeneous etchant; and
   simultaneously, depositing a passivation layer over all exposed surfaces during said etching using said homogeneous etchant having said uniform concentration of hydrocarbons to provide uniform etching results.

2. The method of claim 1 wherein said gas comprises a hydrocarbon containing gas having a chemical formula $C_xH_y$, wherein x is an integer ranging from 1 to 10, and y is an integer ranging from 2 to 22.

3. A method for etching a gate on a semiconductor wafer comprising:
   providing a semiconductor wafer within a processing chamber, said semiconductor wafer having a patterned photo resist layer with varying concentrations of hydrocarbons over a gate layer;
   flowing an etchant into said processing chamber;
   contacting said etchant to said semiconductor wafer to generate a hydrocarbon-containing reaction by-product that is diffused throughout said etchant at varying concentrations across said semiconductor wafer;
   determining a percentage of soft mask photo resist pattern differences across the semiconductor wafer;
   calculating an amount of a hydrocarbon gas that compensates for said pattern differences using said percentage;
   adding said amount of hydrocarbon gas within said processing chamber to equilibrate said varying concentrations of said hydrocarbon-containing reaction by-product and provide a homogeneous etchant across the entire said semiconductor wafer; and
   etching a gate into said gate layer using said patterned photo resist layer by contacting said gate layer with said homogeneous etchant, while simultaneously depositing a passivation layer over all exposed surfaces during said etching to provide uniform etching results.

4. The method of claim 3 further including the step of providing a hard mask layer between said photo resist layer and said gate layer.

5. The method of claim 3 wherein said etchant is selected from the group consisting of a halogen-based plasma in the presence of an oxygen gas, a halogen-based plasma in the presence of a nitrogen gas, and mixtures thereof.

6. The method of claim 3 wherein said hydrocarbon-containing reaction by-product comprises gaseous by-products desorbed from a surface of said photo resist layer.

7. The method of claim 6 wherein said photo resist layer comprises a soft mask photo resist material.

8. The method of claim 3 wherein said hydrocarbon gas is added within said processing chamber in an amount that compensates for the varying amounts of said reaction by-product desorbed from said varying patterned photo resist layer and diffused at varying concentrations throughout said etchant.

9. The method of claim 3 wherein said patterned photo resist layer comprises a patterned hydrocarbon containing resist layer such that upon contact with said etchant, hydrocarbon containing species are desorbed from said patterned hydrocarbon containing resist layer and diffused throughout said etchant at varying concentrations across said semiconductor wafer, and said hydrocarbon gas is added to said processing chamber to equilibrate said varying concentrations of said hydrocarbon containing species throughout said etchant.

10. The method of claim 3 wherein said hydrocarbon gas has a chemical formula $C_xH_y$, wherein x is an integer ranging from 1 to 10, and y is an integer ranging from 2 to 22.

11. The method of claim 3 further including the step of maintaining said uniform concentration of hydrocarbons in said homogeneous etchant by controlling an amount of said hydrocarbon gas added to said processing chamber.

12. The method of claim 3 wherein said etchant, said hydrocarbon-containing reaction by-product, and said hydrocarbon gas together provide a homogeneous etchant within said processing chamber having a uniform concentration of hydrocarbons across the entire said semiconductor wafer.

13. The method of claim 12 further including maintaining said uniform concentration of hydrocarbons in said homogeneous etchant across said semiconductor wafer by controlling an amount of said hydrocarbon gas added within said processing chamber.

14. A method for etching a gate on a semiconductor wafer comprising:
   providing a semiconductor wafer having a photo resist layer with varying patterns with varying concentrations of hydrocarbons over a gate layer;
   providing said semiconductor wafer within a processing chamber;
   flowing an etchant into said processing chamber;

contacting said etchant to said semiconductor wafer to generate varying concentrations of a hydrocarbon-containing reaction by-product across said varying patterns of said photo resist layer;

adding a gas within said processing chamber to compensate for said varying concentrations of said hydrocarbon-containing reaction by-product across said varying patterns by forming a homogeneous etchant having a uniform concentration of hydrocarbons across the entire said semiconductor wafer, wherein when the photo resist layer has a first larger surface area that is larger in size than a second smaller surface area, a first amount of gas is added into the processing chamber when the first larger surface area is exposed as compared to when the second smaller surface area is exposed which requires a second amount of gas being added to the processing chamber, the first amount of gas being less than the second amount of gas, and vice versa, the second amount of gas being larger than the first amount of gas;

maintaining said homogeneous etchant across said entire semiconductor wafer by controlling an amount of said hydrocarbon gas added to said processing chamber;

etching a gate in said gate layer by contacting said gate layer with said homogeneous etchant; and simultaneously, depositing a passivation layer over all exposed surfaces during said etching using said homogeneous etchant having said uniform concentration of hydrocarbons to provide uniform etching results.

* * * * *